United States Patent [19]

Muzzani et al.

[11] 4,204,254
[45] May 20, 1980

[54] ELECTRONIC COMPUTER INCLUDING AN INFORMATION REFRESHING ARRANGEMENT

[75] Inventors: Aldo Muzzani; Ilio Paccapelo, both of Ivrea, Italy

[73] Assignee: Ing. C. Olivetti & C., S.p.A.

[21] Appl. No.: 907,490

[22] Filed: May 19, 1978

[30] Foreign Application Priority Data

May 25, 1977 [IT] Italy .................... 68191 A/77

[51] Int. Cl.² .................... G06F 13/02; G06F 9/16
[52] U.S. Cl. .................... 364/200; 365/222
[58] Field of Search ... 364/200 MS File, 900 MS File; 365/222

[56] References Cited

U.S. PATENT DOCUMENTS

| | | | |
|---|---|---|---|
| 3,518,632 | 6/1970 | Threadgold | 364/200 |
| 3,631,408 | 12/1971 | Kubo | 365/222 |
| 3,760,379 | 9/1973 | Nibby, Jr. | 365/222 |
| 3,800,295 | 3/1974 | Anderson, Jr. | 365/222 |
| 4,040,122 | 8/1977 | Bodin | 364/900 |
| 4,073,006 | 2/1978 | Tubbs | 364/200 |
| 4,084,154 | 4/1978 | Panigrahi | 364/900 |

FOREIGN PATENT DOCUMENTS

| | | | |
|---|---|---|---|
| 2637004 | 3/1977 | Fed. Rep. of Germany | 365/222 |
| 2543515 | 4/1977 | Fed. Rep. of Germany | 365/222 |

*Primary Examiner*—James D. Thomas
*Attorney, Agent, or Firm*—Schuyler, Birch, McKie & Beckett

[57] ABSTRACT

The operative memory of the computer is of the MOS type and is cyclically refreshed under the control of logic circuits, in turn controlled by the timing unit during the microinstructions decoding. Particularly, every machine cycle in which an odd microinstruction is fetched, a row of memory locations is addressed for being refreshed during the same cycle, before the next following machine cycle is started, thus preventing any overlapping of refreshing operation with the CPU operation on the memory.

4 Claims, 3 Drawing Figures

ELECTRONIC COMPUTER INCLUDING AN INFORMATION REFRESHING ARRANGEMENT

BACKGROUND OF THE INVENTION

This invention relates to the electronic computers having a dynamic operative memory and an information refreshing arrangement.

The use of dynamic memories according to the MOS technology has been progressively extended in the field of the electronic computers, due to the low cost thereof with respect to the static memories. These memories are recorded by charging a capacitive element, forming the memory location, and must be recharged or refreshed at a rather high frequency, comparable with the length of the operative cycles of the computer. Therefore, the addresses of the memory, necessary for the computing operations, must be clearly distinguished from those necessary for the information refreshing operations.

In a known information refreshing arrengement, when the refreshing operation are effected, the addressing of the memory for reading or writing operations are prevented. This arrangement thus, on one hand results in a lower speed operation, on the other hand requires additional timing means and/or frequency dividers for generating the timing of the refreshing cycle, and additional circuitry for selectively starting the refreshing cycle and the operation cycle without overlapping.

SUMMARY OF THE INVENTION

According to the invention, in an electronic computer having a dynamic operative memory, a read only memory storing microprograms each one formed of a sequence of microinstructions, a central processing unit cooperating with said operative memory, a timing unit for timing the operations of said processing unit, fetching means included in said processing unit for fetching said microninstructions one at a time from said read only memory, and decoding means also included in said processing unit for decoding the microinstructions so fetched, we now provide an information refreshing arrangement for said operative memory comprising refreshing means conditionable for cyclically refreshing the information stored in said operative memory, and conditioning means operable under the control of said timing unit for conditioning said refreshing means during the operation of said decoding means.

A preferred embodiment of the invention is disclosed, by way of example but not in a limiting sense, in the following description, taken in conjunction with the enclosed drawings.

DESCRIPTION OF THE PREFERRED EMBODIMENT

Figure 1:
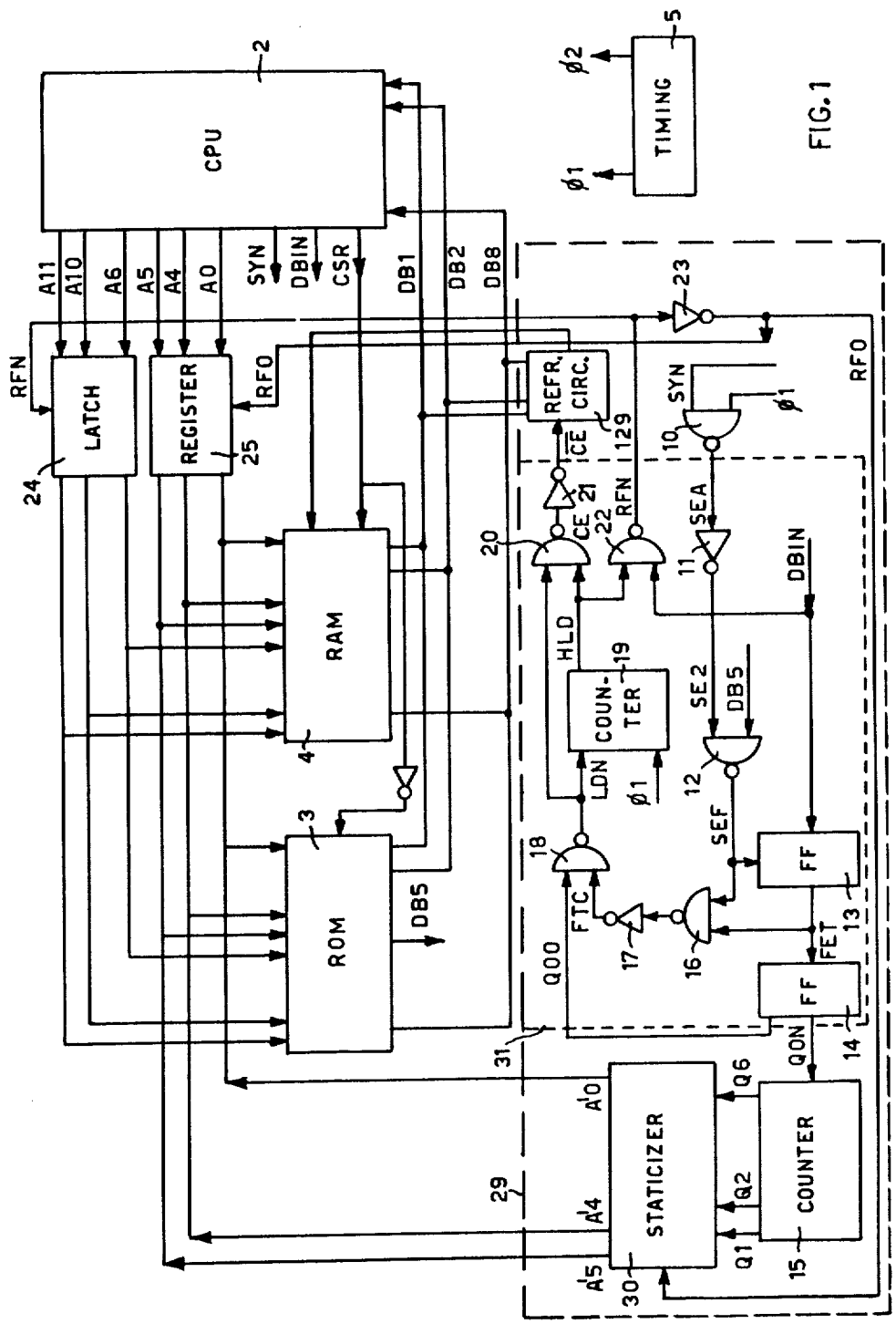
FIG. 1 is a block diagram of an electronic computer embodying an information refreshing arrangement according to the invention.

With reference to FIG. 1, the electronic computer includes at least one read-write operative memory RAM 4, having addressable locations adapted to store data and results of processing operations. The computer also comprises at least one read only memory ROM 3 storing microprograms, each one formed of a sequence of individually addressable microinstructions. Each microinstruction can be formed of eight, sixteen or twentyfour bits.

The computer also comprises a central unit 2, known per se, which is connected by means of twelve conductors A0-A11 to both the ROM 3 and the RAM 4 to address specific locations thereof. Both memories ROM 3 and RAM 4 are in turn connected to the central unit 2 by means of eight conductors DB1-DB5.

More particularly, the central unit 2 includes means for fetching the individual microinstruction of the ROM 3, by generating in a known manner the corresponding address to be applied to the conductors A0-A11. The central unit 2 includes also means for decoding the microinstructions so fetched to generate a set of commands for causing the operations of the central unit 2. Since the fetching and decoding means are conventional in the art, they are not specifically indicated in the FIG. 1.

Upon decoding the current microinstruction, data and results are read or written on the RAM 4 under the control of the central unit 2 at the address normally generated by said decoding means.

The RAM 4 is formed of a square matrix of 64 rows and 64 columns defining 4096 addressable locations. The six bits A0-A5 are used to address one of the 64 columns, whereas the six bits A6-A11 are used to address one of the 64 columns, the addressed location being the one defined by the addressed row and column.

Particularly, a signal CSR, generated by the central unit 2 together with the memory addresses, enables the ROM 3 or the RAM 4 to send an instruction, and respectively a datum, to the central unit. This sending is effected in coincidence with a signal DBIN (see also FIG. 2a) emitted by the central unit 2 (FIG. 1).

The microinstructions stored in the ROM 3 can be of various kind and can have a length from one to three bytes. For example, a JUMP instruction (FIG. 2) takes three bytes, a READ MEMORY or a WRITE MEMORY instruction takes two bytes, a INPUT or OUTPUT instruction takes three bytes. The fetching and execution of a microinstruction requires from one to five machine cycles M1, M2, ... M5, each one formed of a number of machine status T1-T6 variable from four to six. For example, the reading of the ROM 3 requires five machine status, while the reading or writing of the RAM 4 requires only four machine status, due to the different access time of the two memories.

Figure 2:
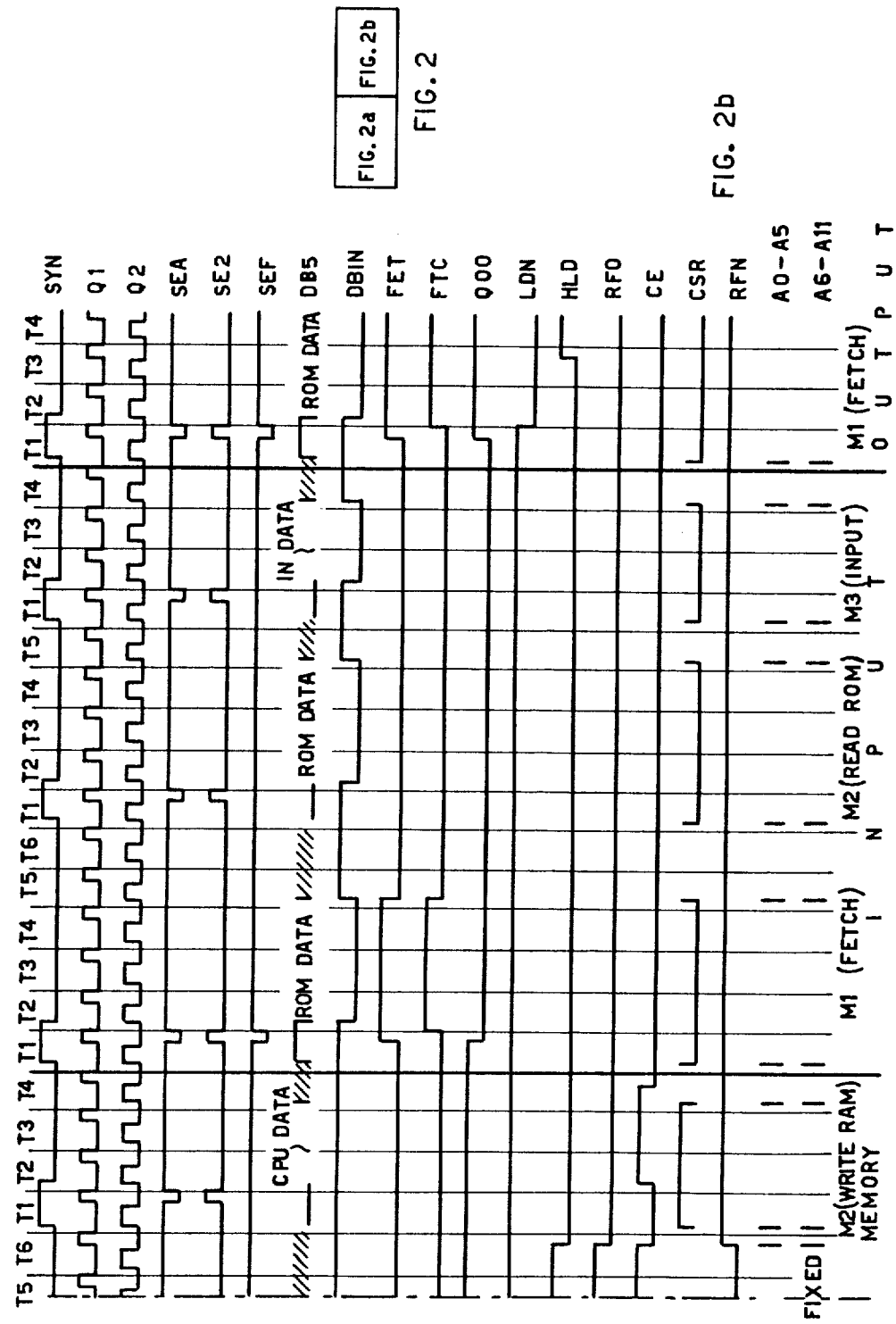
FIGS. 2a and 2b represent a time diagram of the signals generated by the refreshing arrangement.
Figure 2A:
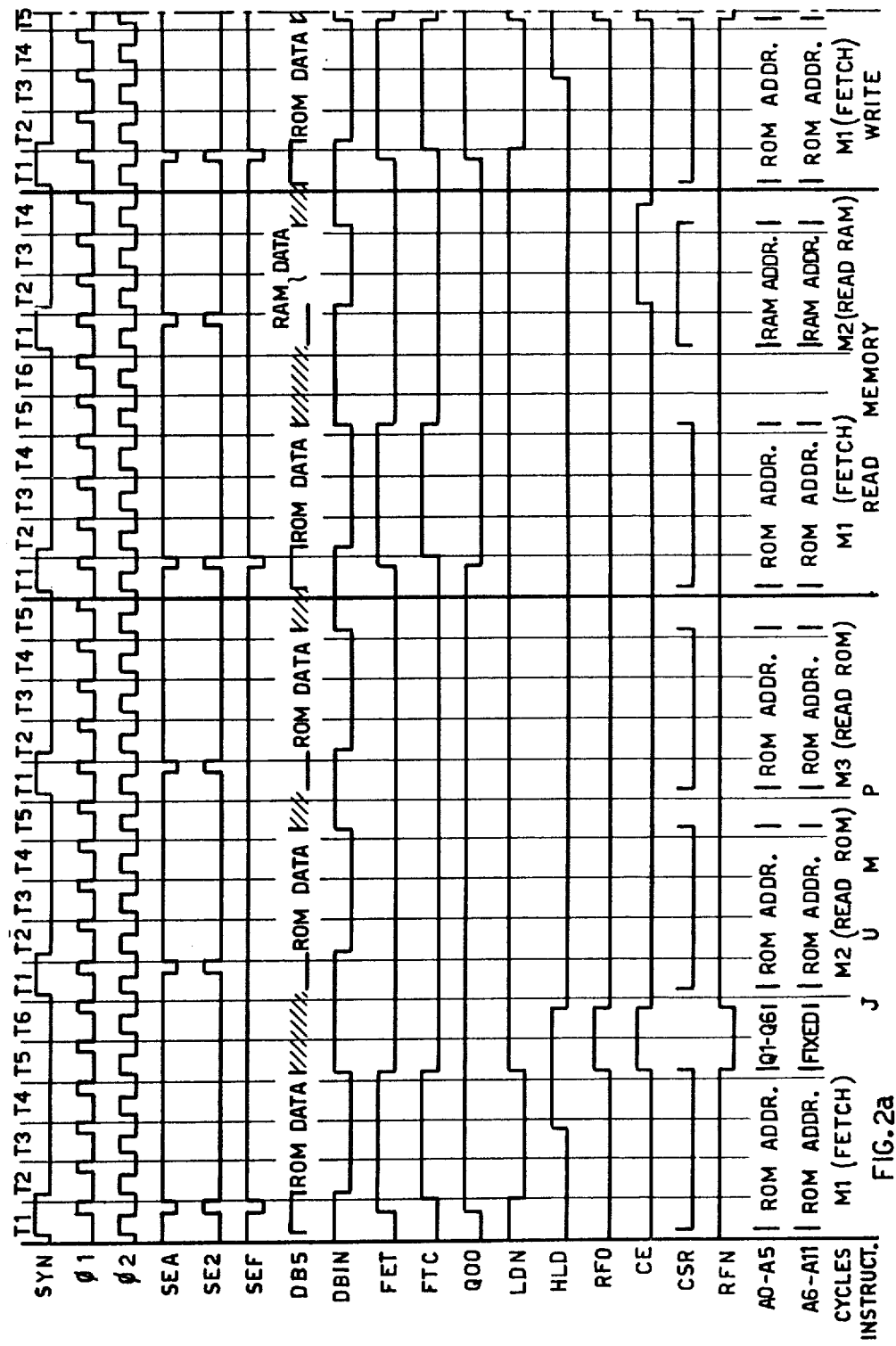

A timing unit 5 (FIG. 1) continuously generates a sequence of pairs of phases $\phi1$, $\phi2$, each pair defining one machine status T1-T6 (FIG. 2). The beginning of each machine cycle is caused by a signal SYN generated by the central unit 2 (FIG. 1).

During the first machine cycle M1 of each microinstruction, the central unit 2 effects always the FETCH operation (FIG. 2), that is the addressing and the extracting of the first byte of the microinstruction from the ROM 3. The negative semiwave of the signal DBIN, generated by the central unit 2 (FIG. 1), defines the time during which the microinstruction is sent through the conductors DB1-DB8 to the unit 2. Immediately after this time, during the status T5 and T6 (FIG. 2) of the cycle M1, the conductors DB1-DB8 are disabled, whereby any signal applied thereto, does not affect the central unit 2.

The RAM 4 is of the dynamic type according to the well known MOS technology, the locations of which are formed by capacitive elements, which are selectively recorded by an electric charge. As it is known, the memory elements or locations are subject to be discharged after a predetermined delay, unless the content of the memory is cyclically refreshed. This refreshing can be effected by reading and rewriting the individual memory locations sequentially addressed at predetermined time interval.

Since the information to be refreshed appears on the conductors DB1-DB8, but is not to be processed by the central unit 2, the problem arises of refreshing the memory without affecting the central unit 2.

For refreshing the memory RAM 4 without affecting the central unit 2, the time following the transmission to the unit 2 of the fetched information during the cycle M1 can be used, provided that the refreshing reading and writing operations be completed before the central unit 12 starts the machine cycle M2. Infact, this cycle can require the reading of the ROM 3 in the case of a JUMP instruction, or the reading or writing of the RAM 4 in the case of the READ MEMORY or WRITE MEMORY instruction. In these case, the conductors A0-A11 are used by the central unit 2 and cannot be used for the refreshing address. Therefore, the machine status T5 and T6 of the cycle M1 can be used for the memory refreshing.

According to the invention, the computer is provided with a refreshing arrangement, generically indicated by the numeral 29 (FIG. 1), including a refreshing circuit 129 conditionable for cyclically refreshing the information stored in the RAM 4, and a conditioning logic circuit 31 operable under the control of the timing unit 5 for conditioning the circuit 129 during the decoding operation in the cycle M1. The circuit 129 is adapted to rewrite on the RAM 4 the information read thereon upon being suitably amplified in a known manner.

In addition, the outputs A0-A5 of the central unit 2 normally feed the address of the row including the required location of the ROM 3 or RAM 4 through a register 25 formed of AND gates. The outputs A6-A11 feed the address of the column including the required location through a normally ineffective latch circuit 24. As it will be seen later, during the refreshing operation the register 25 is cleared and the latch circuit 24 is enable to prevent the addressing of the RAM 4 by the central unit 2.

More particularly, at the beginning of each machine cycle, the central unit 2 generates the signal SYN (FIGS. 1 and 2) together with eight signals appearing on the conductors DB1-DB8. The signal DB5 of which, when activated, indicates that the FETCH cycle of an instruction is started. Then the signal SYN, applied to a NAND gate 10 together with the signal $\phi 1$ of the timing unit 5, generates a signal SEA, which through an inverter 11 generates a signal SE2.

The signal DB5 is applied to a NAND gate 12 together with the signal SE2, to generate a signal SEF. This latter operates as a strobe on a flip-flop 13, which receives also the signal DBIN and is set to generate a signal FET, which appears at any FETCH cycle, as it is apparent from FIG. 2. The raising front of positive semiwave of signal DBIN resets the flip-flop 13, thus defining the end of the fetching operation.

The signal FET is fed to a second flip-flop 14, which generates thus a signal QOO having a frequency half the frequency of the signal FET. The signal QON, which is the negate of QOO, increments a counter 15 having six outputs Q1-Q6, the signals of which are staticized by a staticizer 30 and generate six signals A'0-A'5 which are used to address each time one row of the RAM 4 to be refreshed. Infact, since all the locations of one row have a common wire for the reading and writing, the refreshing of the RAM 4 is effected row by row, whereby the address of the individual columns is not required.

Since the entire RAM 4 must be refreshed every 2 msec, the time required from the refreshing of one row to the next following one must be less than 1/32 msec, that is less than 31.2 $\mu$sec. The logic circuit 31 (FIG. 1) is adapted to generate such higher frequency by using the same FETCH cycles of the machine. Infact, the microinstructions are fetched from the ROM 3 at a time interval comprised between 2 and 10 $\mu$sec and therefore at a frequency much higher than the required maximum interval between the refreshing operations of two subsequent rows.

To this end the signals SEF and FET, which are present at the FETCH cycle of every microinstruction execution, are applied to a NAND gate 16 of the logic circuit 31 to generate a signal, which inverted by the inverter 17 gives a signal FTC. This latter is applied to one of the two inputs of another NAND gate 18, the other input of which receives the signal QOO. The output of the NAND 18 then generates a signal LDN, which is then delayed two machine status T2, T3, by a delay circuit formed of a two stages counter 19 incremented by the signals $\phi 1$, to generate a signal HLD.

Now, on one hand the signal HLD is applied to a NAND gate 20 together with the signal LDN to generate a signal CE. The signal $\overline{CE}$, generated by an inverter 21, causes the refreshing circuit 129 to read the row of the RAM 4 presently addressed by the staticized 30 and to refresh the information stored therein.

On the other hand the signal HLD is applied to a NAND gate 22 together with the signal DBIN to generate a signal RFN. This latter upon being inverted by the inverter 23, enables the staticizer 30 to emit the address A'0-A'5 and clears the register 25, thus temporarily disabling the corresponding address A0-A5 emitted by central unit 2. Simultaneously, the signal RFN is directly applied to the latch circuit 24, which thus is enabled to staticize, during the entire refreshing operation, the addresses A6-A11 of the column. Therefore, any modification of the electric condition on the corresponding conductors A6-A11 does not affect the latch circuit 24. Since all columns of the RAM have a common wire, the column addressed when the signal RFN is generated allows the refreshing of the entire row of the RAM 4 addressed by the staticizer 30.

The timing of the refreshing operation is conditioned by the signal RFN (FIG. 2), which substantially covers the status T5 and T6 of the FETCH cycle M1. It is thus clear that at the subsequent status T1 of the cycle M2, the central unit 2 can emit the memory address A0-A11, without interfering with the refreshing operation. Furthermore, since the frequency of the signal RFN is half the frequency of the signal FET, the row refreshing frequency is one refreshing cycle every two fetching cycles of microinstructions. Since, as it was mentioned before, the longest time required by one microinstruction taking five cycles is 10 $\mu$sec, the row refreshing frequency is one row every 20 $\mu$sec as a maximum. Therefore, the time of 20 $\mu$sec, which can elapse from the refreshing of one row of RAM 4 to the refreshing of the next following row, is less than the above mentioned maximum required time of 31.2 $\mu$sec.

Therefore, it is clear that the arrangement 29 provides for a memory refreshing, which is reliable, inexpensive and free of interferences with the central unit operation.

What we claim is:

1. In an electronic computer having a dynamic operative memory formed of capacitive elements selectively recorded with an electric charge, a read only memory storing microprograms each one formed of a sequence of microinstructions, a central processing unit cooperating with said operative memory, a timing unit for timing the operations of said processing unit for fetching said microinstructions one at a time from said read only memory, and decoding means also included in said processing unit for decoding the microinstructions so fetched to be executed by said processing unit, an information refreshing arrangement for said operative memory comprising: refreshing means conditionable for periodically refreshing the information stored in the capacitive elements of said operative memory, logic means for recognizing a signal indicating the beginning of any microinstruction fetching operation and conditioning means operable under the control of said logic means and said timing unit for conditioning said refreshing means during the operation of said decoding means.

2. An arrangement according to claim 1, including counting means controlled by said logic means for enabling said conditioning means to condition said refreshing means at a predetermined time interval multiple of the interval of said fetching operations.

3. An arrangement according to claim 1, including normally effective addressing means for addressing the individual locations of said operative memory under the control of said central unit, means included in said conditioning means for disabling said addressing means, and additional addressing means for sequentially addressing predetermined groups of said locations under the control of said conditioning means.

4. An arrangement according to claim 3, wherein the locations of said operative memory are organized in rows and columns and said normally effective addressing means include a group of row addressing outputs and a group of columns addressing outputs, said additionally addressing means being adapted to replace one of said groups of outputs, the other outputs being latched during the refreshing operation.

* * * * *